(12) United States Patent
Worledge et al.

(10) Patent No.: US 8,785,966 B2
(45) Date of Patent: Jul. 22, 2014

(54) MAGNETIC TUNNEL JUNCTION TRANSISTOR DEVICES

(75) Inventors: Daniel Christopher Worledge, Cortlandt Manor, NY (US); Vladislav Korenivski, Vallentuna (SE)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 13/115,241

(22) Filed: May 25, 2011

(65) Prior Publication Data

US 2012/0299635 A1    Nov. 29, 2012

(51) Int. Cl.
H01L 27/22    (2006.01)

(52) U.S. Cl.
CPC ............ *H01L 27/228* (2013.01); *H01L 27/226* (2013.01)
USPC ............ 257/108; 257/E43.004; 257/E29.323; 257/E21.665

(58) Field of Classification Search
CPC ............................ H01L 27/228; H01L 27/226
USPC ............ 257/108, E43.004, E29.323, E21.665
See application file for complete search history.

(56) References Cited

U.S. PATENT DOCUMENTS

| | | | |
|---|---|---|---|
| 5,640,343 | A | 6/1997 | Gallagher et al. |
| 6,480,365 | B1 | 11/2002 | Gill et al. |
| 6,593,608 | B1 | 7/2003 | Sharma et al. |
| 7,598,555 | B1 | 10/2009 | Papworth |
| 7,598,579 | B2 | 10/2009 | Horng et al. |
| 7,602,000 | B2 | 10/2009 | Sun et al. |
| 7,679,155 | B2 | 3/2010 | Korenivski |
| 8,411,494 | B2 * | 4/2013 | Shukh ........................... 365/158 |
| 2002/0140016 | A1 * | 10/2002 | Cha ............................... 257/302 |
| 2009/0161422 | A1 | 6/2009 | Zhu et al. |

OTHER PUBLICATIONS

T. Nozaki et al., "rf Amplification in a Three-Terminal Magnetic Tunnel Junction with a Magnetic Vortex Structure," American Institute of Physics, Applied Physics Letters, Jul. 2009, pp. 022513-1-022513-3, vol. 95, No. 2.

J.Z. Sun et al., "A Three-Terminal Spin-Torque-Driven Magnetic Switch," American Institute of Physics, Applied Physics Letters, Jun. 2009, pp. 083506-1-083506-3, vol. 95, No. 10.

B. Behin-Aein et al., "Proposal for an All-Spin Logic Device with Built-in Memory," Nature Nanotechnology, Apr. 2010, pp. 266-270, vol. 5, No. 4.

Y. Shiota et al., "Voltage-Assisted Magnetization Switching in Ultrathin Fe80Co20 Alloy Layers," The Japan Society of Applied Physics, Applied Physics Express, May 2009, pp. 063001-1-063001-3, vol. 2, No. 6.

* cited by examiner

*Primary Examiner* — Amar Movva
(74) *Attorney, Agent, or Firm* — Vazken Alexanian; Ryan, Mason & Lewis, LLP

(57) ABSTRACT

Magnetic tunnel junction transistor devices and methods for operating and forming magnetic tunnel junction transistor devices. In one aspect, a magnetic tunnel junction transistor device includes a first source/drain electrode, a second source/drain electrode, a gate electrode, and a magnetic tunnel junction disposed between the gate electrode and the second source/drain electrode. The magnetic tunnel junction includes a magnetic free layer that extends along a length of the gate electrode toward the first source/drain electrode such that an end portion of the magnetic free layer is disposed between the gate electrode and the first source/drain electrode. The magnetic tunnel junction transistor device switches a magnetization orientation of the magnetic free layer by application of a gate voltage to the gate electrode, thereby changing a resistance between the first and second source/drain electrodes through the magnetic free layer.

25 Claims, 3 Drawing Sheets

100

200

MAGNETIC TUNNEL JUNCTION TRANSISTOR DEVICES

TECHNICAL FIELD

This invention relates generally to magnetic tunnel junction transistor (MTJT) devices and more specifically, to three-terminal magnetic tunnel junction transistor devices, and methods for operating and forming MTJT devices.

BACKGROUND

As is known in the art, a single MTJ device includes a pinned layer, a tunnel barrier layer and a free layer. The magnetization of the pinned layer is fixed in a direction and the resistance of the device depends on the relative orientation of the magnetizations of the free layer and the pinned layers. Recent developments include the use of magnesium oxide (MgO) based magnetic tunnel junction layers. In contrast to a single MTJ element, a double MTJ device includes two tunnel barrier layers and at least two magnetic layers including a thin middle free magnetic layer and at least one outer magnetic layer. The double MTJ device resistance depends on the relative orientation of the magnetization of the middle layer with respect to one or both of the outer layers.

The performance of complementary metal oxide semiconductor (CMOS) devices is currently limited by power dissipation. Reduction of the operating power within a CMOS device is also very limited. Thus, voltage control of magnetism is currently being researched for application to memory and logic devices in an attempt to reduce the operating power necessary.

SUMMARY OF THE INVENTION

Aspects of the invention include magnetic tunnel junction transistor devices, and methods for operating and forming magnetic tunnel junction transistor devices. In one aspect of the invention, a magnetic tunnel junction transistor device includes a first source/drain electrode, a second source/drain electrode, a gate electrode, and a magnetic tunnel junction disposed between the gate electrode and the second source/drain electrode. The magnetic tunnel junction includes a magnetic free layer that extends along a length of the gate electrode toward the first source/drain electrode such that an end portion of the magnetic free layer is disposed between the gate electrode and the first source/drain electrode.

In another aspect of the invention, a magnetic tunnel junction transistor device includes a first source/drain electrode, a second source/drain electrode, a gate electrode, and a double magnetic tunnel junction disposed between the gate electrode and the second source/drain electrode. The double magnetic tunnel junction includes a magnetic free layer that extends along a length of the gate electrode toward the first source/drain electrode such that an end portion of the magnetic free layer is disposed between the gate electrode and the first source/drain electrode. The double magnetic tunnel further includes a first MgO tunnel barrier layer formed on a portion of the magnetic free layer below the second source/drain electrode, a resonant tunneling layer formed on the first MgO tunnel barrier layer, a second MgO tunnel barrier layer formed on the resonant tunneling layer, a CoFeB magnetic pinned layer formed on the second MgO tunnel barrier layer, a coupling layer formed on the CoFeB magnetic pinned layer, a CoFe magnetic pinned layer formed on the coupling layer, and an antiferromagnetic layer formed on the CoFe magnetic pinned layer.

In yet another aspect of the invention, a method is provided for operating a magnetic tunnel junction transistor device having a first source/drain electrode, a second source/drain electrode, a gate electrode, and a magnetic tunnel junction disposed between the gate electrode and the second source/drain electrode, wherein the magnetic tunnel junction comprises a magnetic free layer that extends along a length of the gate electrode toward the first source/drain electrode such that an end portion of the magnetic free layer is disposed between the gate electrode and the first source/drain electrode. The method of operating the magnetic tunnel junction transistor includes switching a magnetization orientation of the magnetic free layer by application of a gate voltage to the gate electrode, thereby changing a resistance between the first and second source/drain electrodes through the magnetic free layer. In another aspect, the transistor device switches between an On state and an Off state based on the gate voltage applied to the gate electrode, wherein the gate voltage ranges between 0 millivolts (mV) to approximately 100 (mV).

In yet other aspects of the method of operating the magnetic tunnel junction transistor device, when the transistor device is in the Off state, a magnetization orientation of the magnetic free layer is in plane with, and antiparallel to, a magnetization orientation of a magnetic pinned layer of the magnetic tunnel junction such that the resistance between the first and second source/drain electrodes through the magnetic free layer is in a high resistance state. When the transistor device in in the On state, a magnetization orientation of the magnetic free layer is perpendicular to a magnetization orientation of a magnetic pinned layer of the magnetic tunnel junction such that the resistance between the first and second source/drain electrodes through the magnetic free layer is in a low resistance state.

These and other aspects, features and advantages of the present invention will become apparent from the following detailed description of preferred embodiments, which is to be read in conjunction with the accompanying figures.

DETAILED DESCRIPTION OF THE PREFERRED EMBODIMENTS

Preferred embodiments of the invention will now be described in further detail with reference to magnetic tunnel junction transistor (MTJT) devices, and methods for operating and forming MTJT devices. It is to be understood, however, that the techniques of the present invention are not limited to the devices and methods shown and described herein. Modifications to the illustrative embodiments will become apparent to those of ordinary skill in the art. It should also be understood that the various layers and/or regions shown in the accompanying figures are not drawn to scale, and that one or more semiconductor layers and/or regions of a type commonly used in such integrated circuits may not be explicitly shown in a given figure for ease of explanation. Particularly with respect to processing steps, it is to be emphasized that the descriptions provided herein are not intended to encompass all of the processing steps that may be required to form a functional integrated semiconductor device. Rather, certain processing steps that are commonly used in forming semiconductor devices, such as, for example, wet cleaning and annealing steps, are purposefully not described herein for economy of description. However, one of ordinary skill in the art will readily recognize those processing steps omitted from these generalized descriptions.

Figure 1:
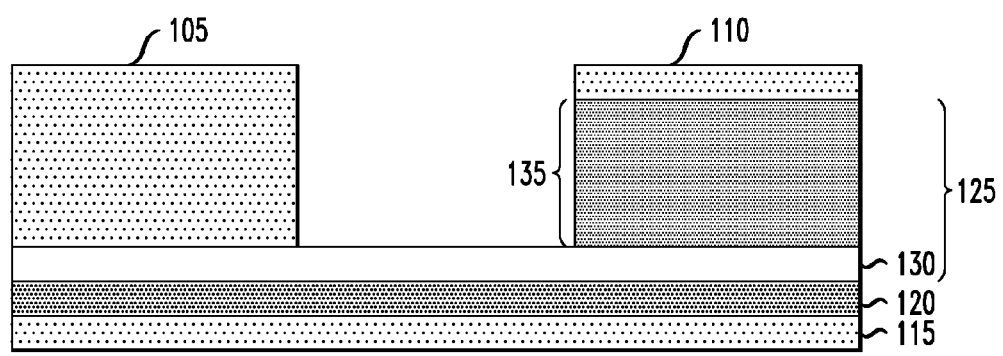
FIG. 1 is a cross-sectional view of a magnetic tunnel junction transistor device according to an exemplary embodiment of the invention.

FIG. 1 is a cross-sectional view of a magnetic tunnel junction transistor device according to an exemplary embodiment of the invention. In particular, FIG. 1 shows a magnetic tunnel junction transistor device 100 comprising a first source/drain electrode 105, a second source/drain electrode 110 and a gate electrode 115. In one exemplary embodiment, the first electrode 105 may be a source electrode and the second electrode 110 may be drain electrode, or in an alternative embodiment, the first electrode 105 may be a drain electrode and the second electrode 110 may be a source electrode. In this regard, the term "source/drain electrode" as used herein refers to the fact that the electrodes 105 and 110 may be source or drain electrodes.

Figure 2:
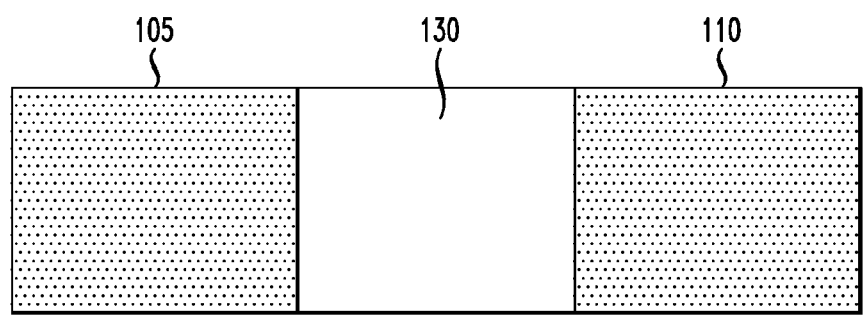
FIG. 2 is a top side view of the magnetic tunnel junction transistor device of FIG. 1, according to an exemplary embodiment of the invention.

The magnetic tunnel junction transistor device 100 further comprises a gate dielectric layer 120 formed on the gate electrode 115 and a magnetic tunnel junction 125 formed on the gate dielectric layer 120 between the gate electrode 115 and the second source/drain electrode 110. The magnetic tunnel junction 125 comprises a first magnetic layer 130 (a free magnetic layer), which is formed on the gate dielectric layer 120 and extends along a length of the gate electrode 115 toward the first source/drain electrode 105 such that an end portion of the magnetic free layer 130 is disposed between the gate electrode 115 and the first source/drain electrode 105. The magnetic tunnel junction 125 further comprises a stack of additional layers 135 comprising at least one magnetic layer and a tunnel barrier layer, providing a single magnetic tunnel junction stack framework. In other exemplary embodiments, the additional stacked layers 135 may include two or more magnetic layers and two or more tunnel barrier layers, and other layers that are commonly implemented to construct other types of magnetic tunnel junction structures such as double magnetic tunnel junction structures. FIG. 2 is a top plan view of the magnetic tunnel junction transistor device of FIG. 1, according to an exemplary embodiment of the invention. The first and second source/drain regions 105, 110 and a portion of the free magnetic layer 130 are shown from a top view of the device 100.

As is known in the art, a basic component of a magnetic tunnel junction is a sandwich of two thin ferromagnetic (and/or ferrimagnetic layers) separated by a very thin insulating layer through which electrons can tunnel. The tunneling current is typically higher when the magnetic moments of the ferromagnetic (F) layers are parallel and lower when the magnetic moments of the two ferromagnetic layers are anti-parallel. The change in conductance for these two magnetic states can be described as a magnetoresistance. In general, the tunneling magnetoresistance (TMR) of a magnetic tunnel junction (MJT) is defined as $(R_{AP}-R_P)/R_P$ where $R_P$ and $R_{AP}$ are the resistance of the MTJ for parallel and anti-parallel alignment of the ferromagnetic layers, respectively.

In accordance with an exemplary embodiment of the invention as depicted in FIG. 1, the magnetic layer 130 is a "free" magnetic layer of the magnetic tunnel junction 125, which is free to rotate in the presence of an applied voltage to the gate electrode 115. The remaining stack 135 comprises at least one fixed magnetic layer having a magnetic moment that is prevented from rotating in the presence of an applied voltage to the gate electrode 115. As will be explained in further detail below, in the absence of an applied voltage to the gate electrode 115, the magnetic moments of the free magnetic layer 130 and at least one fixed magnetic layer within the stack 135 are aligned generally anti-parallel, placing the magnetic tunnel junction 125 in a high resistive state that reduces the tunneling current that flows from the second source/drain electrode 110, through the magnetic tunnel junction 125 and towards the first source/drain electrode 105 through the free magnetic layer 130. As further explained below, when a voltage (e.g., 100 mv) is applied to the gate electrode 115, the magnetic moment of the free magnetic layer 130 will rotate 90 degrees out of the plane of the magnetic layer 130 (either point up or point down), placing the magnetic tunnel junction 125 in a low resistive state that increases the tunneling current that flows from the second source/drain electrode 110, through the magnetic tunnel junction 125 and towards the first source/drain electrode 105 through the free magnetic layer 130.

Figure 3:
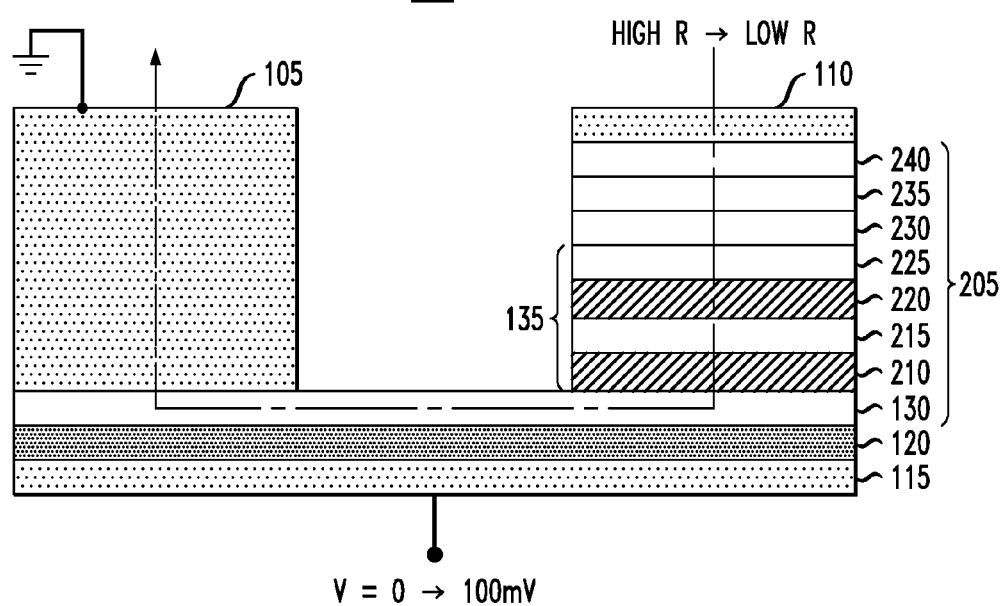
FIG. 3 is a cross-sectional view of a magnetic tunnel junction transistor device according to another exemplary embodiment of the invention.

FIG. 3 is a cross-sectional view of a magnetic tunnel junction transistor device according to another exemplary embodiment of the invention. In particular, FIG. 3 shows a three-terminal magnetic tunnel junction transistor device 200 comprising a first source/drain electrode 105, a second source/drain electrode 110, a gate electrode 115, similar to the magnetic tunnel junction transistor device 100 of FIG. 1. FIG. 3 illustrates an exemplary embodiment of a double magnetic tunnel junction 205 architecture, which can be implemented as the high-level, generic, magnetic tunnel junction stack 125 of FIG. 1. As with the magnetic tunnel junction 125 of FIG. 1, the magnetic tunnel junction 205 of FIG. 2 comprises a free magnetic layer 130 formed on the gate dielectric layer 120, wherein the free magnetic layer 130 extends along a length of the gate electrode 115 toward the first source/drain electrode 105 such that an end portion of the magnetic free layer 130 is disposed between the gate electrode 115 and the first source/drain electrode 105.

In the exemplary embodiment of FIG. 2, the magnetic tunnel junction 205 stack further comprise a first tunnel barrier layer 210 formed on a portion of the free magnetic layer 130, a resonant tunneling layer 215 formed on the first tunnel barrier layer 210, a second tunnel barrier layer 220 formed on the resonant tunneling layer 215, a first pinned magnetic layer 225 formed on the second tunnel barrier layer 220, a coupling layer 230 formed on the first pinned layer 225, a second pinned layer 235 formed on the coupling layer 230, and an antiferromagnetic layer 240 formed on the second pinned layer 235 in contact with a cap layer 110 (the second source/drain electrode).

In various exemplary embodiments of the invention, the source/drain electrode 105, 100 and the gate electrode 115 may be formed of tantalum (Ta), or other suitable metallic electrode materials. The gate dielectric layer 120 may be formed of magnesium oxide (MgO) or any other suitable insulating or dielectric material. In one preferred embodiment, the gate dielectric layer 120 is formed of MgO with a thickness of about 3 nm. The free magnetic layer 130 may be formed of iron (Fe) or a magnetic material including at least one of cobalt (Co) or iron (Fe) or nickel (Ni), or any combination thereof. The free magnetic layer 130 may be formed with a thickness in a range of approximately 0.5 nanometers (nm) to approximately 2 nanometer (nm).

In further exemplary embodiments, first and second tunnel barrier layers 210 and 220 may be formed of at least one of magnesium oxide (MgO), aluminum oxide (AlO), or titanium oxide (TiO) or any other suitable materials. In a preferred embodiment, the first and second tunnel barrier layers 210 and 220 are formed of MgO having a thickness in a range from approximately 0.5 nanometers (nm) to approximately 2 nanometers (nm). The resonant tunneling layer 215 is preferably a non-magnetic tunneling layer that is formed of Vanadium and having a thickness of about 1 nm.

In other exemplary embodiments, the first and second pinned layers 225 and 235 may be formed of a magnetic material including at least one of cobalt (Co) or iron (Fe), or any combination thereof. In a preferred embodiment, the first pinned layer 225 is a reference layer that is formed of CoFeB and the second pinned layer 235 is formed of CoFe. Further, the first and second pinned layers 225 and 235 may be formed of a predetermined thickness ranging from approximately 1 nanometers (nm) to approximately 5 nanometers (nm). The coupling layer 230 is formed of a material, such as Ru (ruthenium), which couples the two magnetic layers 225 and 235 on the top and bottom of the coupling layer 230. The coupling layer 230 ensures that magnetization of the pinned magnetic layer 225 (the reference layer) is anti-parallel to the magnetization of the pinned layer 235. The antiferromagnetic layer 240 is preferably made of PtMn (platinum manganese) or any other suitable material, which can pin the magnetic orientation of the ferromagnetic film forming the pinned layer 235. As is known, antiferromagnets can couple to ferromagnets, for instance, through a mechanism known as exchange anisotropy (for, example, wherein an aligning magnetic field is applied either when a ferromagnetic film is grown upon the antiferromagnet or during subsequent annealing) causing the surface atoms of the ferromagnet to align with the surface atoms of the antiferromagnet. This provides the ability to pin the orientation of a ferromagnetic film.

In the exemplary embodiment of FIG. 3, the stack of layers 130/210/215/220/225 forms a double magnetic tunnel junction framework, which provides high magnetoresistance for operating the magnetic tunnel junction transistor device 200. According to an exemplary mode of operation of the MTJT device 200, the magnetization of the pinned reference layer 225 remains in fixed position (pointing left or right) while the magnetization orientation of the free magnetic layer 130 is switched by applying a gate voltage to the gate electrode 115. When a gate voltage of 0V is applied to the gate electrode 115, the device 200 is in a high resistive (HighR) state, and when a gate voltage of Vdd (e.g., 100 mV) is applied to the gate electrode 115, the device 200 is in a low resistive (LowR) state, and substantial current (as indicated by the dotted line) will flow from the second source/drain electrode 110, through the magnetic tunnel junction 205 and towards the first source/drain electrode 105 through the free magnetic layer 130. Exemplary modes of operation of the magnetic tunnel junction transistor device 200 of FIG. 3 will now be described in further detail with reference to FIGS. 4 and 5.

Figure 4:
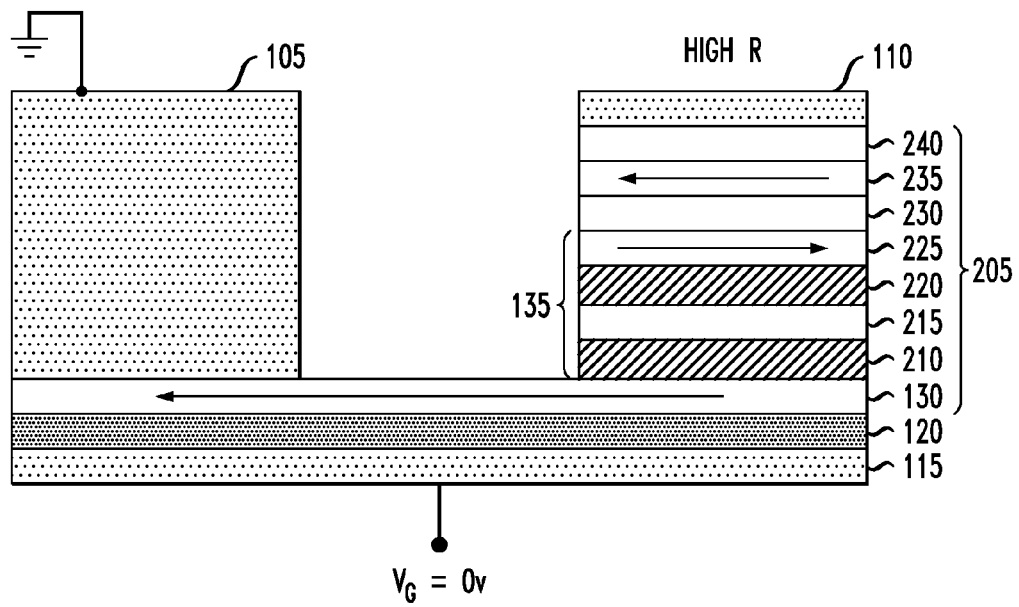
FIG. 4 is a diagram schematically illustrating an OFF state of the magnetic tunnel junction transistor device of FIG. 3, according to an exemplary embodiment of the invention.
Figure 5:
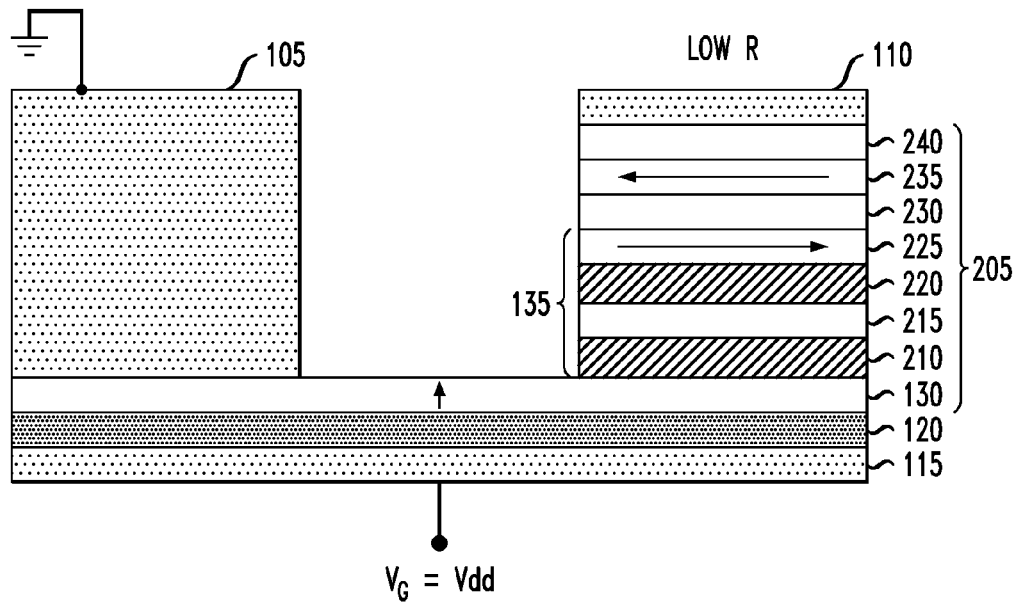
FIG. 5 is a diagram schematically illustrating an ON state of the magnetic tunnel junction transistor device of FIG. 3, according to another exemplary embodiment of the invention.

FIG. 4 is a diagram schematically illustrating an OFF state of the magnetic tunnel junction transistor device 200 of FIG. 3 and FIG. 5 is a diagram schematically illustrating an ON state of the magnetic tunnel junction transistor device 200 of FIG. 3, according to exemplary embodiments of the invention. As generally depicted in FIGS. 4 and 5, the resistance of the magnetic tunnel junction 205 stack is modulated by applying a gate voltage (between, e.g., 0 and 100 my) to switch the magnetization orientation of the free magnetic layer 130 between in-plane and perpendicular. By forming the free magnetic layer 130 of a different thickness from that of the first pinned layer 225 (reference layer), the device 200 may have a normally in-plane and a normally perpendicular magnetization.

More specifically, as depicted in FIG. 4, when a voltage of 0V is applied to the gate terminal, 115, the magnetic tunnel junction transistor device 200 is in an OFF state. While in the OFF state, the magnetization orientation of the free magnetic layer 130 is in plane, and antiparallel, with a magnetization orientation of the first pinned layer 225, such that a resistance between the first and second source/drain electrodes is in a high resistance state. In FIG. 4, the second pinned layer 235 is shown to have an in-plane magnetization that points to the left, while the first pinned layer 225 is shown to have an in-plane magnetization that points to the right, such that the in-plane magnetizations of the first and second pinned layers 225 and 235 are anti-parallel. In this exemplary embodiment, the second pinned layer 235 does not significantly contribute to the magnetoresistance characteristics of the magnetic tunnel junction stack 205, but the second pinned layer 235 serves (in conjunction with the coupling layer 230) to pin the in-plane magnetization of the first pinned layer 225 to the right. This fixed in-plane magnetization of the first pinned layer 225 is anti-parallel to the in-plane magnetization of the magnetic free layer 130 while the device 200 is in the OFF state.

Next, referring to FIG. 5, when a gate voltage of Vdd (e.g., 100 mv) is applied to the gate electrode 115, the magnetic tunnel junction transistor device 100 is switched to an ON state, wherein the magnetization orientation of the free magnetic layer 130 is rotated up (or down) 90 degrees to be perpendicular to the in-plane magnetization orientation of the first pinned layer 225. Under these conditions, the magnetic tunnel junction device 200 is in a LowR state, and current will flow from the second source/drain electrode 110, down through the magnetic tunnel junction 205 and towards the first source/drain electrode 105 through the free magnetic layer 130.

In particular, when a voltage is applied to the gate electrode 115, the gate dielectric layer 120 modifies the anisotropy of the free magnetic layer 130 such that when the voltage is applied, the modification of charge and bonding at an interface between the free magnetic layer 130 and the tunnel barrier layer 210 causes the magnetization of the free magnetic layer 130 to change from in-plane to perpendicular as shown in FIGS. 4 and 5, respectively, and vice versa. Moreover, the change in magnetization direction with respect to the fixed magnetization direction of the first pinned layer 225 causes a shift in the quantized energy levels in the free magnetic layer 130, thus, changing the resistance of the magnetic tunnel junction stack 205 and modulating the current flowing between the first and second source/drain electrode 105 and 110. Further, a device 200 that is of a normally high resistance switches to a low resistance when a voltage is applied to the gate electrode 115 and a device 200 of a normally low resistance switches to a high resistance when a voltage is applied to the gate electrode 115.

Further aspects of the present invention provide three-terminal magnetic tunnel junction transistor devices and methods for operating three-terminal magnetic tunnel junction devices, which can be utilized in integrated circuits with various analog and digital circuitry. In particular, integrated circuit dies can be fabricated having magnetic tunnel junction transistor devices and other semiconductor devices such as a field-effect transistors, bipolar transistors, metal-oxide-semiconductor transistors, diodes, resistors, capacitors, inductors, etc., forming analog and/or digital circuits. The magnetic tunnel junction transistor devices can be formed upon or within a semiconductor substrate, the die also comprising the substrate. An integrated circuit in accordance with the present invention can be employed in applications, hardware and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A magnetic tunnel junction transistor device, comprising:
    a first source/drain electrode;
    a second source/drain electrode;
    a gate electrode; and
    a magnetic tunnel junction disposed between the gate electrode and the second source/drain electrode, the magnetic tunnel junction comprising a magnetic free layer that extends along a length of the gate electrode toward the first source/drain electrode such that an end portion of the magnetic free layer is disposed between the gate electrode and the first source/drain electrode,
    wherein a voltage applied to the gate electrode changes a magnetization orientation of the magnetic free layer.

2. The transistor device of claim 1, wherein the magnetic tunnel junction is a single magnetic tunnel junction structure.

3. The transistor device of claim 1, wherein the magnetic tunnel junction is a double magnetic tunnel junction structure.

4. The transistor device of claim 1, further comprising a gate dielectric layer interposed between the gate electrode and the magnetic free layer.

5. The transistor device of claim 4, wherein the gate dielectric layer is formed of MgO.

6. The transistor device of claim 1, wherein the first and second source/drain electrodes and the gate electrode are formed of tantalum.

7. The transistor device of claim 1, wherein the magnetic tunnel junction further comprises:
    a first tunnel barrier layer formed on a portion of the magnetic free layer;
    a resonant tunneling layer formed on the first tunnel barrier layer;
    a second tunnel barrier layer formed on the resonant tunneling layer; and
    a first magnetic pinned layer formed on the second tunnel barrier layer.

8. The transistor device of claim 7, wherein the first and second tunnel barriers are formed of MgO.

9. The transistor device of claim 7, wherein the resonant tunneling layer is formed of Vanadium.

10. The transistor device of claim 7, wherein the first magnetic pinned layer is formed of a magnetic material including at least one of cobalt (Co), or iron (Fe), or any combination thereof.

11. The transistor device of claim 7, wherein the magnetic tunnel junction further comprises:
    a coupling layer formed on the first magnetic pinned layer;
    a second magnetic pinned layer formed on the coupling layer;
    an antiferromagnetic layer formed on the second magnetic pinned layer.

12. The transistor device of claim 11, wherein the coupling layer is formed of Ru.

13. The transistor device of claim 11, wherein the second magnetic pinned layer is formed of a magnetic material including at least one of cobalt (Co), or iron (Fe), or any combination thereof.

14. The transistor device of claim 11, wherein the antiferromagnetic layer is formed of PtMn.

15. A magnetic tunnel junction transistor device comprising:
    a first source/drain electrode;
    a second source/drain electrode;
    a gate electrode; and
    a double magnetic tunnel junction disposed between the gate electrode and the second source/drain electrode, the double magnetic tunnel junction comprising:
        a magnetic free layer that extends along a length of the gate electrode toward the first source/drain electrode such that an end portion of the magnetic free layer is disposed between the gate electrode and the first source/drain electrode, wherein a voltage applied to the gate electrode changes a magnetization orientation of the magnetic free layer;
        a first MgO tunnel barrier layer formed on a portion of the magnetic free layer below the second source/drain electrode;
        a resonant tunneling layer formed on the first MgO tunnel barrier layer;
        a second MgO tunnel barrier layer formed on the resonant tunneling layer;
        a CoFeB magnetic pinned layer formed on the second MgO tunnel barrier layer;
        a coupling layer formed on the CoFeB magnetic pinned layer;
        a CoFe magnetic pinned layer formed on the coupling layer; and
        an antiferromagnetic layer formed on the CoFe magnetic pinned layer.

16. The transistor device of claim 15, further comprising a gate dielectric layer interposed between the gate electrode and the magnetic free layer.

17. The transistor device of claim 16, wherein the gate dielectric layer is formed of MgO with a thickness of about 3 nm.

18. The transistor device of claim 16, wherein the first and second source/drain electrodes and the gate electrode are formed of tantalum.

19. The transistor device of claim 16, wherein the resonant tunneling layer is formed of Vanadium with a thickness of about 1 nm.

20. A method for operating a magnetic tunnel junction transistor device having a first source/drain electrode, a second source/drain electrode, a gate electrode, and a magnetic tunnel junction disposed between the gate electrode and the second source/drain electrode, wherein the magnetic tunnel junction comprises a magnetic free layer that extends along a length of the gate electrode toward the first source/drain electrode such that an end portion of the magnetic free layer is disposed between the gate electrode and the first source/drain electrode, the method comprising:

switching a magnetization orientation of the magnetic free layer by application of a gate voltage to the gate electrode, thereby changing a resistance between the first and second source/drain electrodes through the magnetic free layer.

21. The method of claim 20, wherein the transistor device switches between an On state and an Off state based on the gate voltage applied to the gate electrode.

22. The method of claim 21, wherein the gate voltage ranges between approximately 0 millivolts (mV) to approximately 100 (mV).

23. The method of claim 21, wherein when the transistor device is in the Off state, a magnetization orientation of the magnetic free layer is in plane with, and antiparallel to, a magnetization orientation of a magnetic pinned layer of the magnetic tunnel junction such that the resistance between the first and second source/drain electrodes through the magnetic free layer is in a high resistance state.

24. The method of claim 21, wherein when the transistor device is in the On state, a magnetization orientation of the magnetic free layer is perpendicular to a magnetization orientation of a magnetic pinned layer of the magnetic tunnel junction such that the resistance between the first and second source/drain electrodes through the magnetic free layer is in a low resistance state.

25. A semiconductor integrated circuit, comprising a plurality of magnetic tunnel junction transistor devices formed on a bulk substrate, each of the magnetic tunnel junction transistor devices comprising:
    a first source/drain electrode;
    a second source/drain electrode;
    a gate electrode; and
    a magnetic tunnel junction disposed between the gate electrode and the second source/drain electrode, the magnetic tunnel junction comprising a magnetic free layer that extends along a length of the gate electrode toward the first source/drain electrode such that an end portion of the magnetic free layer is disposed between the gate electrode and the first source/drain electrode,
    wherein a voltage applied to the gate electrode changes a magnetization orientation of the magnetic free layer.

* * * * *